United States Patent
Zeng et al.

(10) Patent No.: US 9,806,714 B2
(45) Date of Patent: Oct. 31, 2017

(54) INTEGRATED RF MEMS ON ATE LOADBOARDS FOR SMART SELF RF MATCHING

(71) Applicant: Advantest Corporation, Tokyo (JP)

(72) Inventors: Xin Ping Zeng, San Jose, CA (US); Hui Yu, San Jose, CA (US); Keith Schaub, Austin, TX (US); Liang Ge, San Jose, CA (US); Heng Huat Goh, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 657 days.

(21) Appl. No.: 14/149,720

(22) Filed: Jan. 7, 2014

(65) Prior Publication Data
US 2015/0194956 A1 Jul. 9, 2015

(51) Int. Cl.
H03K 19/00 (2006.01)
G01R 31/28 (2006.01)

(52) U.S. Cl.
CPC ..... H03K 19/0005 (2013.01); G01R 31/2822 (2013.01); G01R 31/2834 (2013.01)

(58) Field of Classification Search
CPC ............ H03K 10/0005; G01R 31/2822; G01R 31/2834; G01R 27/28; G01R 1/0408; G01R 1/045; G01R 1/06716; G01R 27/26; G01R 29/08; G01R 29/10; G01R 31/00; G01R 31/2839; G01R 31/2889; G01R 35/055; H03H 7/38; H03H 7/40; H04B 17/02
See application file for complete search history.

(56) References Cited

U.S. PATENT DOCUMENTS

| | | | |
|---|---|---|---|
| 2010/0127721 A1* | 5/2010 | Kuo ................... | G01R 31/2822 324/755.01 |
| 2011/0187399 A1* | 8/2011 | Laquai ..................... | H01P 5/12 324/756.01 |
| 2012/0319697 A1* | 12/2012 | Gregg ................ | G01R 31/2822 324/511 |
| 2013/0234741 A1* | 9/2013 | Mow ..................... | H01Q 1/243 324/750.01 |
| 2014/0167793 A1* | 6/2014 | Vanden Bossche ... | G01R 31/00 324/750.01 |
| 2014/0179239 A1* | 6/2014 | Nickel .................. | H04W 24/00 455/67.14 |

* cited by examiner

Primary Examiner — Clayton E Laballe
Assistant Examiner — Ruifeng Pu (57) ABSTRACT

In a testing device, a method for implementing automatic RF port testing. The method includes attaching a device under test having a plurality of RF pins to a load board, dynamically tuning a plurality of RF ports of the load board to the plurality of RF pins, and automatically matching the plurality of RF ports to the plurality of RF pins with respect to impedance. The method further includes implementing an RF port testing process on the device under test.

18 Claims, 6 Drawing Sheets

RF MEMs Functional Block Diagram

RF MEMs Integrated onto loadboard

INTEGRATED RF MEMS ON ATE LOADBOARDS FOR SMART SELF RF MATCHING

FIELD OF THE INVENTION

The present invention is generally related to computer system test equipment.

BACKGROUND OF THE INVENTION

RF devices continue to be highly integrated with multiple bands, multiple standards and often with greater than 20 RF ports on a single device. The current time required to match such devices using the traditional manual approach can be two or three weeks. Combine this with today's massive parallel test capabilities of ATE (×4, ×8, and even ×16) and the time required to properly match ~80+ RF ports across multiple sites can easily surpass several weeks.

RF matching has largely remained unchanged for the past several decades. The engineer typically employs an iterative, manual, time-intensive approach of placing and removing various LC components onto the load board. After each iteration a VNA is employed to measure the new match. This process repeats until the best match (typically as close to 50 Ohms) is found. This method is completely incapable of scaling to meet the needs of the modern industrial manufacturing processes.

Thus there exists a need for next-generation automated high-speed testing. There exists a need for technology that delivers unprecedented test time and test cost reductions.

SUMMARY OF THE INVENTION

In a testing device, a method for implementing automatic RF port testing. The method includes attaching a device under test having a plurality of RF pins to a load board, dynamically tuning a plurality of RF ports of the load board to the plurality of RF pins, and automatically matching the plurality of RF ports to the plurality of RF pins with respect to impedance. The method further includes implementing an RF port testing process on the device under test.

In one embodiment, the testing device comprises an RF electronics device.

In one embodiment, a plurality of RF electronics devices are tested simultaneously.

In one embodiment, the load board further comprises an RF MEMs impedance matching device.

In one embodiment, wherein the dynamically tuning of the plurality of RF ports is software controlled and configured.

In one embodiment, the load board further comprises an RF MEMs impedance matching device having a tunable impedance matching circuit.

In one embodiment, the load board further comprises programmable capacitive elements implemented in a CMOS RF MEMs impedance matching structure.

In one embodiment, the present invention is implemented as a non-transitory computer readable memory having computer readable code which when executed by a computer system causes the computer system to implement a method for implementing automatic RF port testing. The method includes attaching a device under test having a plurality of RF pins to a load board, dynamically tuning a plurality of RF ports of the load board to the plurality of RF pins, and automatically matching the plurality of RF ports to the plurality of RF pins with respect to impedance. The method further includes implementing an RF port testing process on the device under test.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Notation and Nomenclature:

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system (e.g., computer system 400 of FIG. 4), or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the Invention:

Embodiments of the present invention implement integrated RF MEMs on ATE (Automatic Test Equipment) loadboards for smart self RF matching. As used herein, the term "MEMs" micro electro mechanical systems (e.g., devices and structures) made using micro-fabrication techniques. Embodiments of the present invention employ RF MEMs to largely automate the RF matching process used on load boards.

RF matching has largely remained unchanged for the past several decades. The engineer typically employs an iterative, manual, time-intensive approach of placing and removing various LC components onto the load board. After each iteration a measurement device is employed to measure the new match. This process repeats until the best match (e.g., typically as close to 50 Ohms) is found. For a single port device, this manual approach, albeit cumbersome, was "good enough", and acceptable to the marketplace.

RF devices continue to be highly integrated with multiple bands, multiple standards and often with greater than 20 RF ports on a single device. The current time required to match such devices using the traditional manual approach can be two or three weeks. Combine this with today's massive parallel test capabilities of ATE (e.g., ×4, ×8, and even ×16) and the time required to properly match approximately 80 or more RF ports across multiple sites can easily surpass several weeks. Embodiments of the present invention eliminate the traditional manual matching approach, which was unsustainable in the electronics manufacturing industry.

Embodiments of the present invention solve a number of problems in the electronics manufacturing industry. One such problem is the "Negative Time-to-Market" problem. With time to market expectations shrinking to just a few months, the industry cannot sustain such a high T™ cost. Another such problem is the "Higher Yield Loss" problem. The manual tuning of multiple ports across multiple sites and multiple testers leads to correlation issues that leads to yield loss and increases cost. These problems are avoided by the automated RF matching process of embodiments of the present invention.

Figure 1:
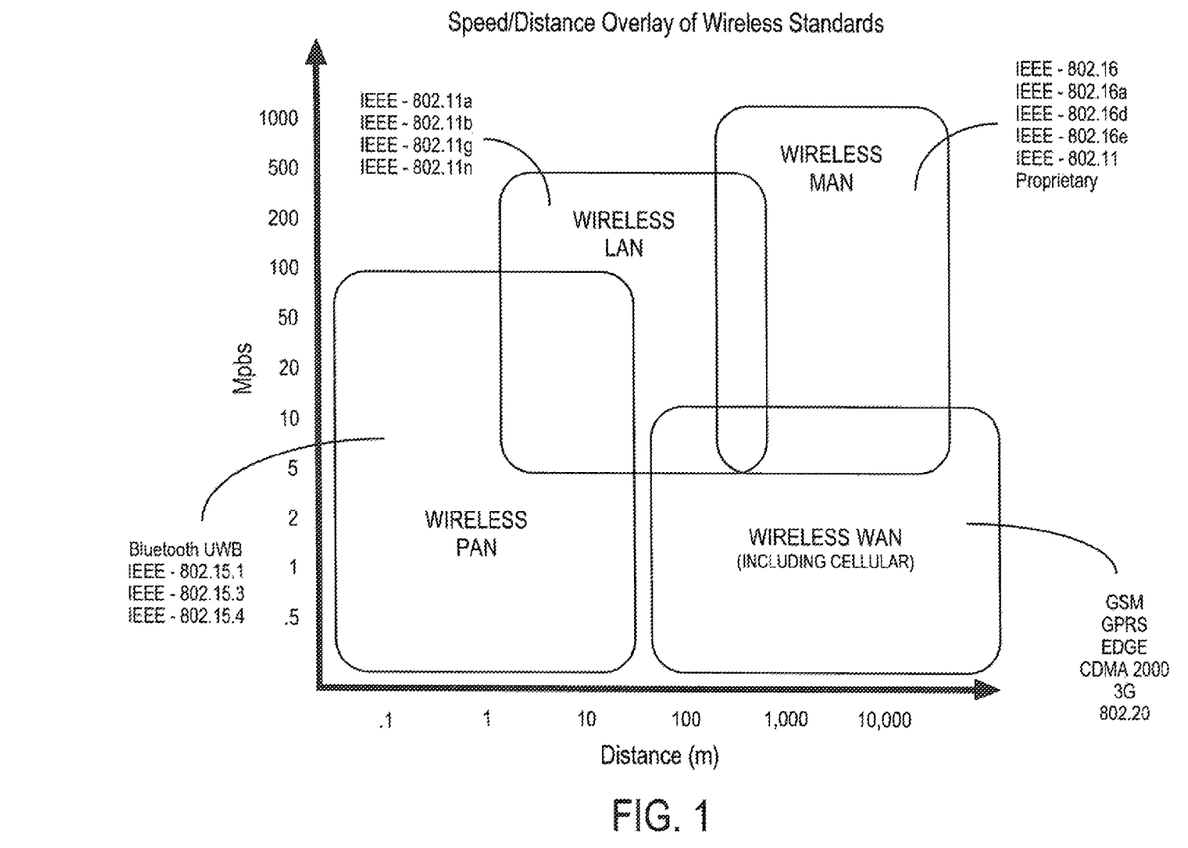
FIG. 1 shows a diagram illustrating a speed/distance overlay of wireless standards as used by embodiments of the present invention.

FIG. 1 shows a diagram illustrating a speed/distance overlay of wireless standards as used by embodiments of the present invention. The explosive growth of Wi-Fi and VoIP enterprise service is challenging the existing landscape. LTE roll-out is in progress and demand for more services, higher speeds and lower costs has generated a myriad of standards, as shown in FIG. 1. The mobile communications market is one of the world's fastest growing markets in terms of both products and services. The handset market has more than 4 billion subscribers worldwide.

Accordingly, the net result is the rapid evolution of multi-band, multi-standard wireless devices. With the increased number of frequency bands, number of RF ports, and number of sites, the loadboard complexity has exponentially grown. Despite significant advances in ATE hardware and software, the conventional RF matching of the load boards to the ATE interfaces has largely remained unchanged for decades. Conventionally, it is left to the test engineer to manually match each RF port on the loadboard.

Embodiments of the present invention advantageously introduces the concept of Smart Loadboards™. Embodiments of the present invention use integrated RF MEMs tunable impedance matching network technology with an SPI interface to eliminate the conventional lengthy, tedious and cumbersome manual RF tuning process. By integrating this technology, embodiments of the present invention effectively provides the electronics manufacturing industry with Smart Loadboards™ capable of self-matching and dynamic tuning Embodiments of the present invention address a number of the industry's problems and provide several key benefits:

1) Smart Loadboards™ Improve Time-to-Market
   a. The Smart Loadboards™ dramatically reduce Time-to-Market by self-tuning to the optimum match. Self-tuning eliminates the recursive manual trial and error process.
   b. Smart Loadboards™ simplify and improve site-to-site correlation. Smart algorithms can be employed to optimize matching from site-to-site.
   c. Tester to tester correlation simplified and automated
2) Reduces Cost
   a. Site to site correlation made easier
   b. Variations reduced from greater tuning resolution
   c. Eliminates the need for expensive RF tuning expert
3) Enhances Yield
   a. Greater tuning resolution and range improves yield
   b. Eliminates load board variations introduced from manual process
   c. As Loadboards™ are interchanged from tester to tester, Smart Loadboards™ can automatically adjust their match for tester to tester variations.

Figure 2:
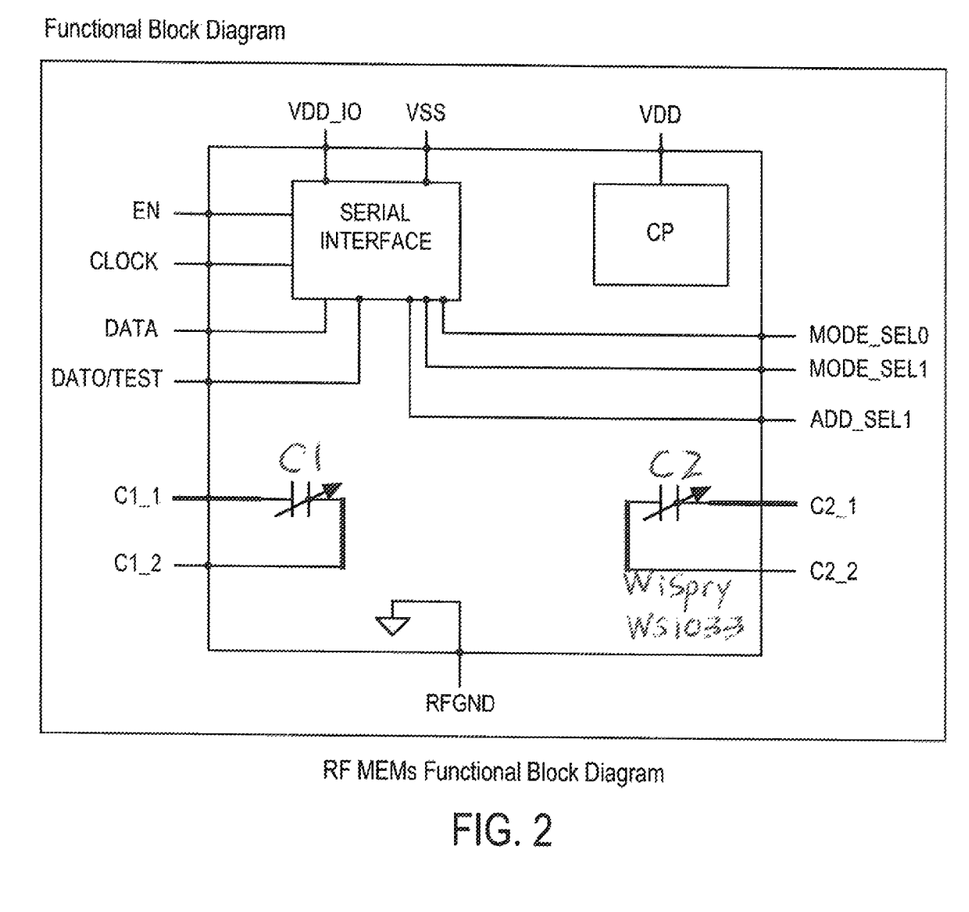
FIG. 2 shows a functional block diagram of an RF MEMs Circuit in accordance with one embodiment of the present invention.

FIG. 2 shows a functional block diagram of an RF MEMs Circuit in accordance with one embodiment of the present invention. In the FIG. 2 embodiment, the WS2017 tunable impedance matching circuit is used. It is designed to be inserted in the RF signal chain between the DUT (Device Under Test) and the ATE RF ports. In this embodiment, the tuning range is from 824 MHz to 2170 MHz (e.g., the current generation).

The innovative tunable capacitor technology combines excellent RF performance from a high-Q parallel plate capacitor and fixed inductance network with versatile digital control of the capacitance values. The entire TX/RX signal chains can now be optimized resulting in superior performance, lower cost, and faster time to market. The impedance match is digitally controlled by the programmable capacitive elements implemented in CMOS-RF-MEMS structure. This is shown in the FIG. 2 functional block diagram.

Figure 3:
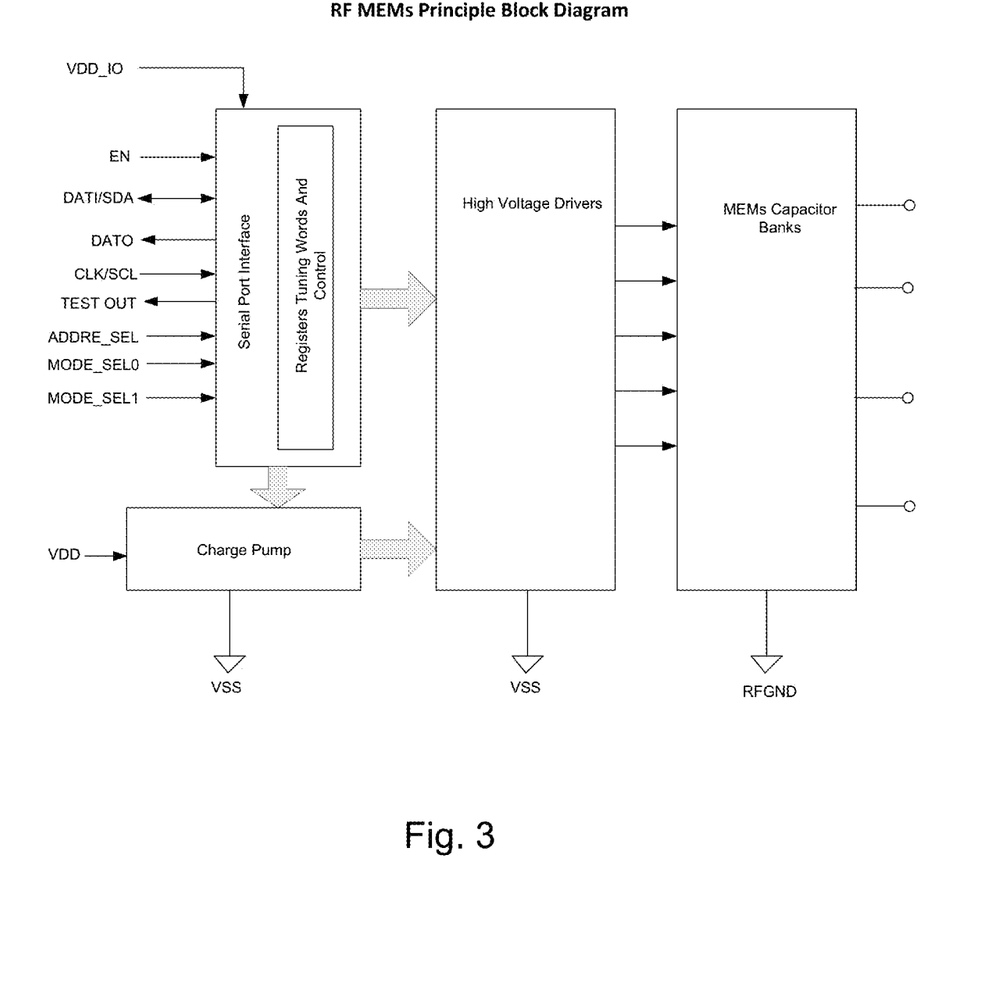
FIG. 3 shows a principal block diagram of an RF MEMs circuit device in accordance with one embodiment of the present invention.

Features of this new Integrated RF MEMS Technology include:
   True single chip CMOS tuner
   Frequency range 824 MHz-2170 MHz
   Corrects VSWR up to 20:1
   Covers GSM850, EGSM, DCS, PCS and WCDMA
   0.125 pF step size
   Software controlled FIG. 3 shows a principal block diagram of an RF MEMs circuit device in accordance with one embodiment of the present invention. In the FIG. 3 embodiment, an array of integrated capacitors can be programmed using the integrated SPI, I2C and other supported standards. Using the integrated VNA capabilities of testers in combination with the integrated RF MEMs technology and digital control, the loadboard becomes a Smart Loadboard™. Self tuning software having smart algorithms will automatically tune and match the loadboard for all ports and for all sites. The process is automatic, self-correcting, and requires just a few minutes versus the several weeks of the manual process.

Figure 4:
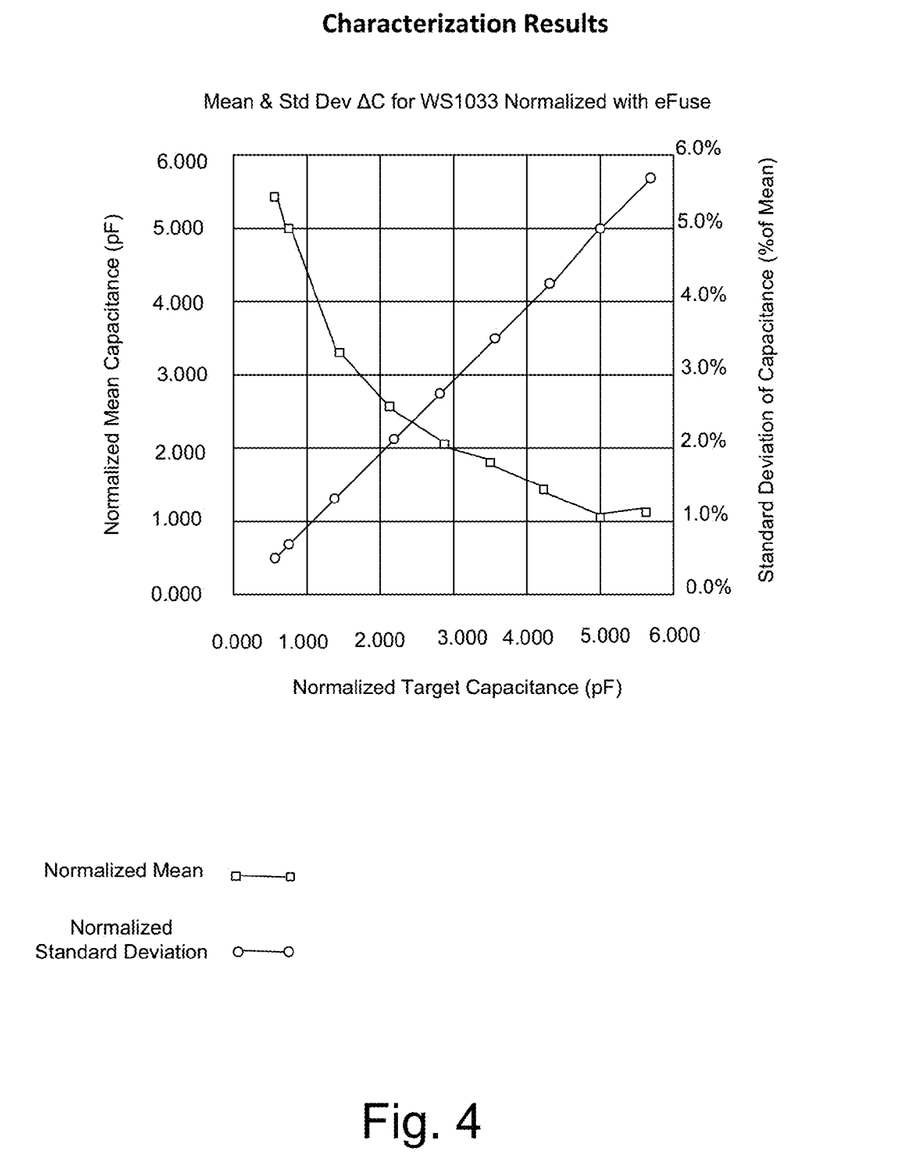
FIG. 4 shows a characterization results diagram of the normalized target capacitance in accordance with one embodiment of the present invention.

FIG. 4 shows a characterization results diagram of the normalized target capacitance in accordance with one embodiment of the present invention. The left-hand side of FIG. 4 shows normalized mean capacitance in pico-farads. The right-hand side of FIG. 4 shows a standard deviation of capacitance as a percent of the mean.

In this manner, embodiments of the present invention have introduced the concept of Smart Loadboards™ and shown that by using integrated RF MEMS technology on ATE load boards, that the time-to-market, and cost of test (COT) can be greatly reduced. Additionally, superior performance, and less variation from site-to-site as well as tester-to-tester improves test yield and further reduces cost.

Figure 5:
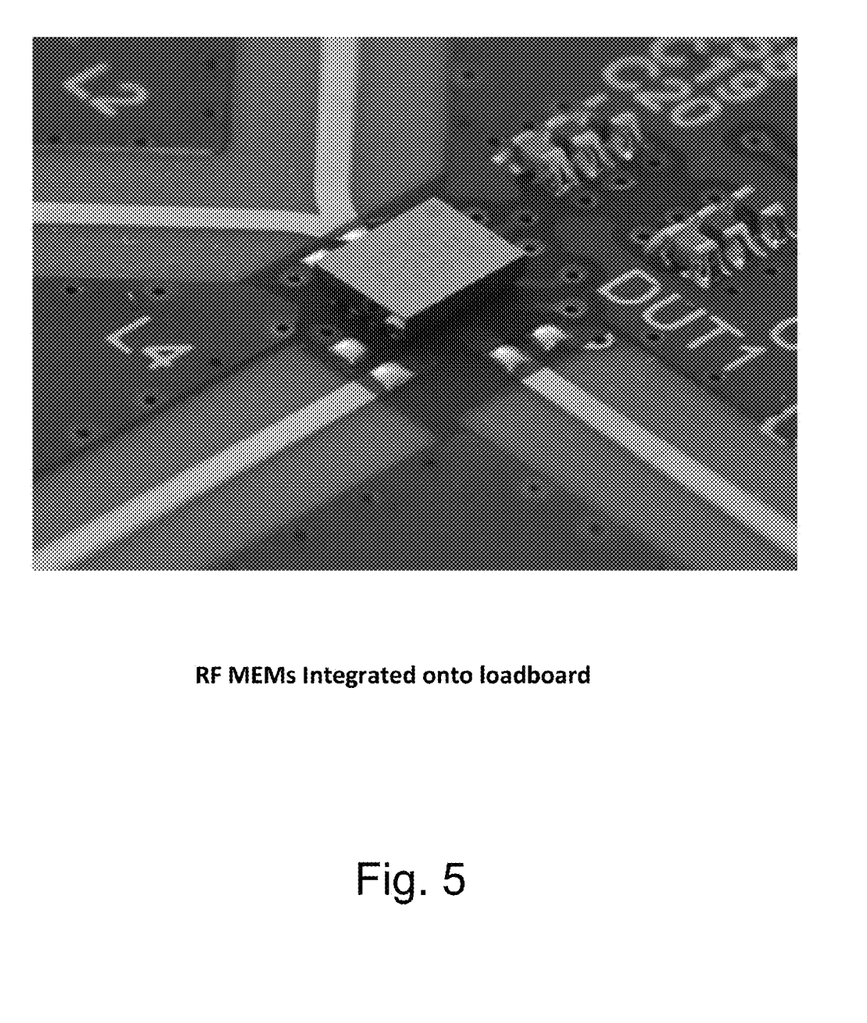
FIG. 5 shows a diagram of an RF MEMs device integrated onto a longboard in accordance with one embodiment of the present invention.

FIG. 5 shows a diagram of an RF MEMs device integrated onto a longboard in accordance with one embodiment of the present invention. In a different embodiment, integrating the RF MEMs onto an actual load board with physical DUT can be implemented in a different manner. In such different embodiments, the integration of the RF MEMs onto Advantest load boards with a physical DUT will be further optimized.

Figure 6:
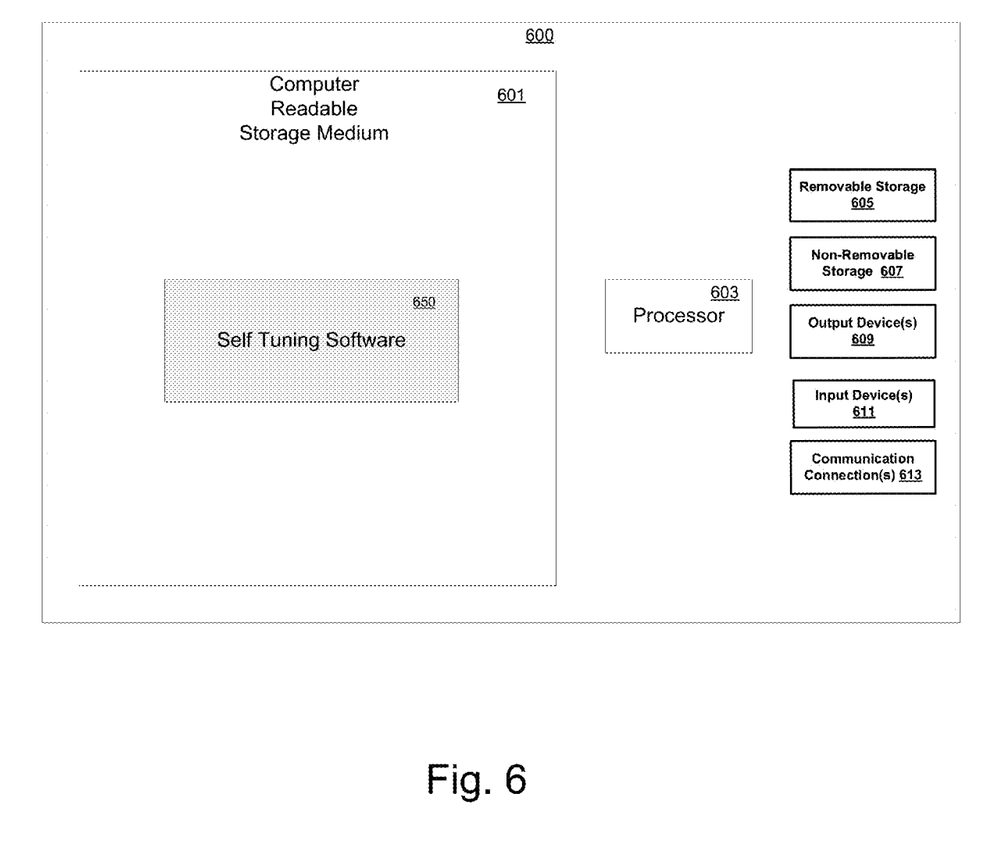
FIG. 6 shows an exemplary computer system 600 according to one embodiment.

Computer System Platform:

FIG. 6 shows an exemplary computer system 600 according to one embodiment. Computer system 600 depicts the components of a basic computer system providing the execution environment for certain hardware-based and software-based functionality for the above described embodiments. Computer system 600 can be implemented as, for example, a server computer system, workstation computer system, desktop computer system, or laptop computer system. Similarly, computer system 600 can be implemented as a handheld device. Computer system 600 typically includes at least some form of computer readable media (e.g., computer readable storage medium 601). Computer readable media can be a number of different types of available media that can be accessed by computer system 600 and can include, but not limited to, computer storage media.

In its most basic configuration, computer system 600 typically includes processing unit 603 and a computer readable storage medium 601. Depending on the exact configuration and type of computer system 600 that is used, memory 601 can be volatile (e.g., such as DRAM, etc.) 601a, non-volatile 601b (e.g., such as ROM, flash memory, etc.) or some combination of the two. Similarly, the memory 601 can comprise other devices besides solid-state devices, such as, for example, magnetic disk-based media, optical media, or the like.

Additionally, computer system 600 can include other mass storage systems (e.g., removable 605 and/or non-removable 607) such as magnetic or optical disks or tape. Similarly, computer system 600 can include input devices 609 and/or output devices 611 (e.g., such as a display). Computer system 600 can further include network connections 613 to other devices, computers, networks, servers, etc. using either wired or wireless media. As all of these devices are well known in the art, they need not be discussed in detail.

It should further be noted, that the computer system 600 can have some, most, or all of its functionality supplanted by a distributed computer system having a large number of dispersed computing nodes, such as would be the case where the functionality of the computer system 600 is partly or wholly executed using a cloud computing environment.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for implementing automatic RF port testing in an automated testing equipment, the method comprising:
    subsequent to a device under test being coupled to a load board of the automated testing equipment, dynamically tuning impedance at a plurality of RF ports of the load board to a plurality of RF pins of the device under test through an impedance matching device, wherein the impedance matching device is an integral component of the load board;
    automatically matching the plurality of RF ports to the plurality of RF pins with respect to impedance; and
    implementing an RF port testing process on the device under test.

2. The method of claim 1 further comprising testing a plurality of RF electronics devices simultaneously through the load board.

3. The method of claim 1, wherein the impedance matching device comprises an RF MEMs impedance matching device.

4. The method of claim 1, wherein the dynamically tuning at the plurality of RF ports is software controlled and configured.

5. The method of claim 3, wherein the impedance matching device comprises a tunable impedance matching circuit.

6. The method of claim 1, wherein the impedance matching device comprises programmable capacitive elements implemented in a CMOS RF MEMs impedance matching structure.

7. A non-transitory computer readable memory having computer readable code which when executed by a processor causes the processor to implement a method for implementing automatic RF port testing, the method comprising:
    after a device under test is coupled to a load board of an automated testing equipment, dynamically tuning impedance at a plurality of RF ports of the load board to a plurality of RF pins of the device under test through an impedance matching device that is an integral component of the load board;

automatically matching the plurality of RF ports to the plurality of RF pins with respect to impedance; and implementing an RF port testing process on the device under test.

8. The non-transitory computer readable memory of claim 7, wherein the method further comprises testing a plurality of RF electronics devices simultaneously.

9. The non-transitory computer readable memory of claim 7, wherein the impedance matching device comprises an RF MEMs impedance matching device.

10. The non-transitory computer readable memory of claim 7, wherein the dynamically tuning at the plurality of RF ports is software controlled and configured.

11. The non-transitory computer readable memory of claim 7, wherein the impedance matching device comprises a tunable impedance matching circuit.

12. The non-transitory computer readable memory of claim 7, wherein the impedance matching device comprises programmable capacitive elements implemented in a CMOS RF MEMs impedance matching structure.

13. An automated test system comprising:
an RF measurement device;
a load board comprising:
 a plurality of RF ports configured to couple a device under test with the automated test equipment through a plurality of RF pins of the device under test:
 an impedance matching device coupled to the plurality of RF ports;
a processor coupled to the load board; and
memory coupled to the processor and comprising instructions that, when executed by the processor, cause the automated test system to implement a method of:
 dynamically tuning the impedance matching device to automatically match impedance at the plurality of RF ports to the plurality of RF pins; and
 implementing an RF port testing process on the device under test.

14. The automated test system of claim 13, wherein the RF measurement device comprises a Vector network analyzer (VNA).

15. The automated test system of claim 13, wherein the method further comprises testing a plurality of RF electronics devices simultaneously.

16. The automated test system of claim 13, wherein the impedance matching device comprises an RF MEMs impedance matching device.

17. The automated test system of claim 16 wherein the RF MEMs impedance matching device comprises a tunable impedance matching circuit.

18. The automated test system of claim 16 wherein RF MEMs impedance matching device comprises programmable capacitive elements implemented in a CMOS RF MEMs impedance matching structure.

* * * * *